(12) United States Patent
Noda

(10) Patent No.: US 6,709,961 B2
(45) Date of Patent: Mar. 23, 2004

(54) METHOD FOR FABRICATING SEMICONDUCTOR DEVICE

(75) Inventor: Taiji Noda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 10/235,830

(22) Filed: Sep. 6, 2002

(65) Prior Publication Data

US 2003/0049917 A1 Mar. 13, 2003

(30) Foreign Application Priority Data

Sep. 7, 2001 (JP) ..................................... 2001-271330

(51) Int. Cl.$^7$ ............................................. H01L 21/22
(52) U.S. Cl. ..................... 438/549; 438/527; 438/530; 257/336
(58) Field of Search ................. 438/510, 519–523, 438/527–533, 542–550, 560, 566; 257/327–336

(56) References Cited

U.S. PATENT DOCUMENTS

| | | | |
|---|---|---|---|
| 5,710,055 A | * | 1/1998 | Kizilyalli ..................... 437/45 |
| 5,793,088 A | * | 8/1998 | Choi et al. ................... 257/408 |
| 6,063,682 A | * | 5/2000 | Sultan et al. ................ 438/305 |
| 6,333,217 B1 | * | 12/2001 | Umimoto et al. ........... 438/197 |
| 6,365,473 B1 | * | 4/2002 | Lee ............................ 438/303 |

OTHER PUBLICATIONS

Noda et al. "Effects of End–Of–Range Dislocation Loops on Transient Enhanced Diffusion of Indium Implanted In Silicon" *Journal of Applied Statistics*, vol. 88, No. 9, pp. 4980–4984.

* cited by examiner

*Primary Examiner*—Caridad Everhart
*Assistant Examiner*—Calvin Lee
(74) *Attorney, Agent, or Firm*—McDermott, Will & Emery

(57) ABSTRACT

As impurity ions for forming a channel, heavy ions are implanted multiple times at a dose such that no dislocation-loop defect layer is caused to be formed, and an annealing process is performed after each ion implantation process has been carried out, thereby forming a heavily doped channel layer having a steep retro-grade impurity profile.

7 Claims, 7 Drawing Sheets

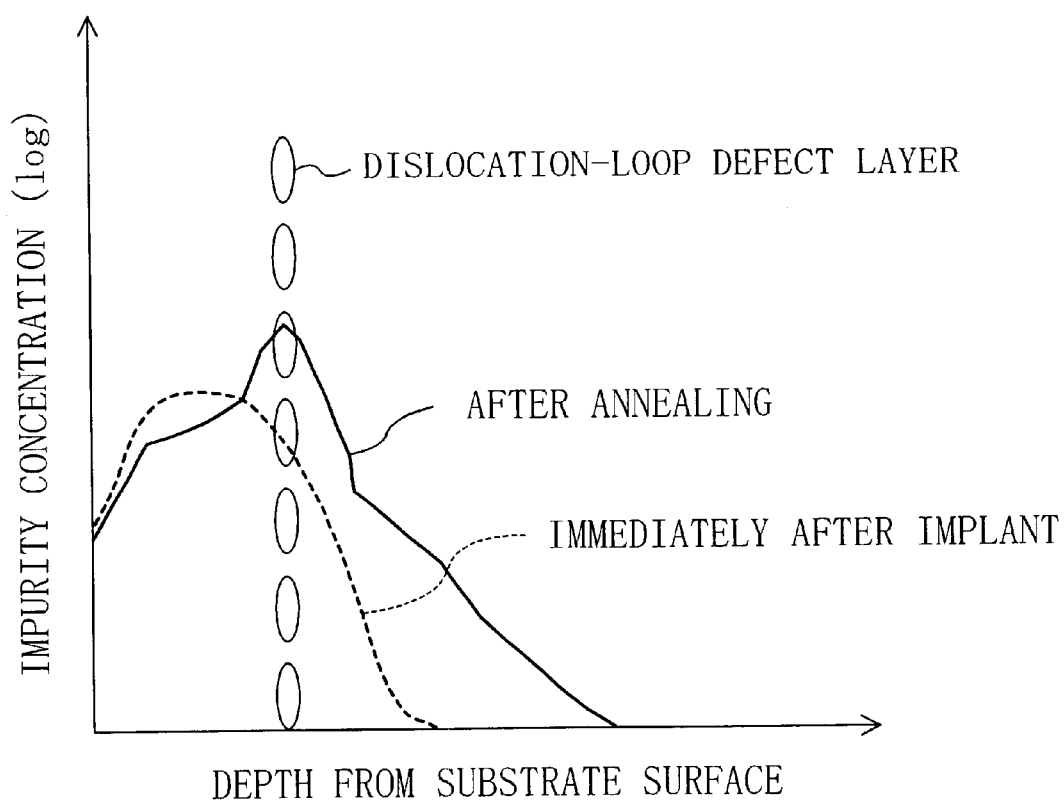

METHOD FOR FABRICATING SEMICONDUCTOR DEVICE

BACKGROUND OF THE INVENTION

The present invention relates to MIS-semiconductor-device fabrication methods for attaining further reduced dimension while enabling high-speed operation with low power consumption.

As the number of devices included in a semiconductor integrated circuit continues to increase, MIS transistors are required to be further decreased in size. To achieve such downsizing, MIS transistors need to have a heavily doped channel structure in which the channel region has a high impurity concentration.

A conventional method for fabricating an MIS transistor will be described with reference to the accompanying drawings.

FIGS. 5A through 5C and FIGS. 6A and 6B are cross-sectional views illustrating process steps in the conventional method for fabricating an MIS transistor.

First, ions of indium (In) as a p-type impurity are implanted into a semiconductor substrate 101 of p-type silicon at an acceleration voltage of 100 keV and at a dose of approximately $1 \times 10^{14}/cm^2$. After the ion implantation process has been performed, an annealing process is carried out, thereby forming a p-type doped channel layer 102 in a channel-formation region in the semiconductor substrate 101 as shown in FIG. 5A.

Next, as shown in FIG. 5B, a gate oxide film 103 with a thickness of about 1.5 nm is formed on the semiconductor substrate 101, and a gate electrode 104 of polysilicon with a thickness of about 100 nm is formed on the gate oxide film 103.

Next, as shown in FIG. 5C, with the gate electrode 104 used as a mask, ions of arsenic (As) as an n-type impurity are implanted into the semiconductor substrate 101 at an acceleration voltage of 2 keV and at a dose of about $5 \times 10^{14}/cm^2$, thereby forming n-type implantation layers 105A. Then, with the gate electrode 104 used as a mask, ions of boron (B) as a p-type impurity are implanted into the semiconductor substrate 101 at an acceleration voltage of 5 keV and at a dose of approximately $2 \times 10^{13}/cm^2$, thereby forming p-type implantation layers 106A.

Thereafter, as shown in FIG. 6A, an insulating film of silicon nitride or silicon oxide is deposited to a thickness of approximately 50 nm on the semiconductor substrate 101. The deposited insulating film is then subjected to an anisotropic etching process, thereby forming sidewalls 107 on the lateral faces of the gate electrode 104.

Subsequently, with the gate electrode 104 and the sidewalls 107 as shown in FIG. 6B used as a mask, ions of arsenic as an n-type impurity are implanted into the semiconductor substrate 101 at an acceleration voltage of 15 keV and at a dose of approximately $3 \times 10^{15}/cm^2$. The semiconductor substrate 101 is then subjected to a high-temperature, short-term annealing process. In this manner, n-type doped source/drain layers 108 are defined in regions in the semiconductor substrate 101 laterally with respect to each sidewall 107. At the same time, the ions existing in the n-type implantation layers 105A are diffused, whereby n-type doped extension layers 105B are defined in regions in the semiconductor substrate 101 between the n-type doped source/drain layers 108 and the p-type doped channel layer 102. And the ions existing in the p-type implantation layers 106A are diffused, whereby p-type doped pocket layers 106B are defined in regions in the semiconductor substrate 101 underneath the n-type doped extension layers 105B.

As described above, in the conventional MIS transistor-fabrication method, in order to attain transistor downsizing without making the short channel effects become evident, indium ions, which are heavy ions having a larger mass number than that of boron (B) ions, are used as impurity ions to form the p-type doped channel layer 102 and furthermore, the indium ion implantation dose is likely to be made larger.

However, implanting indium ions at a high dose into the semiconductor substrate 101 causes the ion-implanted region of the semiconductor substrate 101 to become amorphous. Thus, when the subsequent annealing process is carried out to activate the ions implanted, an EOR (end-of-range) dislocation-loop defect layer (hereinafter referred to simply as "dislocation-loop defect layer") forms in the lower vicinity of the interface between the amorphous layer and the crystal layer, and the indium is strongly segregates to the dislocation-loop defect layer. As a result, the activated concentration decreases in the p-type doped channel layer 102, such that a desired impurity profile cannot be obtained.

The formation of the dislocation-loop defect layer in the p-type doped channel layer 102 also causes a leakage current to flow along the dislocation-loop defect layer.

FIG. 7 is a graph showing an impurity profile in the p-type doped channel layer 102 for the cross section taken along the line A—A shown in FIG. 5A. In FIG. 7, the abscissa represents the depth from the substrate surface while the ordinate represents the concentration of the indium ions logarithmically. As can be seen from FIG. 7, distribution of the indium contained in the p-type doped channel layer 102 segregates to the dislocation-loop defect layer formed near the amorphous-crystal interface due to the annealing process.

Accordingly, with the conventional semiconductor-fabrication method, the formation, indispensable for transistor downsizing, of heavily doped channel layers such that they have desired impurity concentration is difficult.

SUMMARY OF THE INVENTION

In view of the above problems, an object of the present invention is to ensure high impurity concentration in a doped channel layer while controlling manifestation of the short channel effects that accompany downsizing, and at the same time to control increases in a leakage current caused by a low threshold voltage and by the high-impurity-concentration channel.

To achieve the above object, according to a semiconductor fabrication method of the present invention, heavy ions are implanted multiple times, as impurity ions for forming a channel, at such a dose as not to cause a dislocation-loop defect layer to form, and an annealing process is performed after every time the ions have been implanted, whereby a heavily doped channel layer having a steep retro-grade impurity profile can be obtained.

Specifically, an inventive method for fabricating a semiconductor device includes the steps of (a) implanting ions of a first impurity of a first conductivity type, which are heavy ions having a relatively large mass number, multiple times into a channel-formation region in a semiconductor substrate at a dose such that the channel-formation region is not caused to become amorphous, and carrying out a first annealing process after each of the ion implantations has been performed, thereby removing the implantation damage in the channel-formation region and at the same time forming a first doped layer of the first conductivity type in the channel-formation region; (b) forming a gate insulating film on the semiconductor substrate, and selectively forming a gate electrode on the gate insulating film; (c) implanting ions of a second impurity of a second conductivity type into the semiconductor substrate with the gate electrode used as a mask; and (d) subjecting the semiconductor substrate to a second annealing process to diffuse the ions of the second impurity, thereby forming a second doped layer of the second conductivity type having a relatively shallow junction site.

According to the inventive method, no dislocation-loop defect layer is formed in the channel-formation region through the first annealing process that is carried out after the heavy ions have been implanted. It is therefore possible to prevent the heavy ions implanted into the channel-formation region from segregating to the dislocation-loop defect layer and being deactivated. Leakage current caused by the dislocation-loop defect layer can also be prevented since no dislocation-loop defect layer is formed.

Additionally, since the heavy ions are implanted multiple times at a low dose, the impurity concentration of the channel-formation region is not deficient. Moreover, the heavy ions are implanted at a dose such that no amorphization is caused and the annealing process is performed after each implantation has been carried out, which can restore the semiconductor crystal from post-implantation damage that each heavy-ion implantation instance causes. Accordingly, it can be ensured that a doped channel layer having a predetermined high impurity concentration is realized by using heavy ions.

In the step (d) of the inventive method, a dislocation-loop defect layer may be formed in the second doped layer in the semiconductor substrate, and by segregation of the ions of the first impurity to the dislocation-loop defect layer, a third doped layer of the first conductivity type may be formed in a region under the second doped layer.

Then, it is not necessary to form a doped pocket layer, which is made of the third doped layer whose conductivity type is different from that of the second doped layer, under a doped extension layer, which is made of the second doped layer. This results in suppressing the short channel effect further.

Alternatively, the inventive method may further include, between the steps (b) and (d), the steps of: implanting ions of a third impurity of the first conductivity type into the semiconductor substrate with the gate electrode used as a mask; and through the second annealing process, diffusing the ions of the third impurity to form a third doped layer of the first conductivity type under the second doped layer.

Then, it can be ensured that a doped pocket layer, which is made of the third doped layer, is formed.

The inventive method preferably further includes, the steps of, after the step (d) has been performed: forming a sidewall out of an insulating film on a lateral face of the gate electrode; and implanting ions of a fourth impurity of the second conductivity type into the semiconductor substrate with the gate electrode and the sidewall used as a mask, and then performing a third annealing process to diffuse the ions of the fourth impurity, thereby forming, outward of the second doped layer, a fourth doped layer of the second conductivity type, the forth doped layer having a deeper junction than the second doped layer.

In the inventive method, the heavy ions are preferably implanted at a dose not more than approximately $5 \times 10^{13}/\text{cm}^2$.

In the inventive method, the first annealing process is preferably a rapid thermal annealing process in which the annealing temperature is increased to a peak temperature of about 850° C. through 1050° C. at a rate not less than about 100° C./sec. and then the peak temperature is either maintained for about ten seconds at longest, or not maintained.

In the inventive method, the heavy ions are preferably indium ions.

BRIEF DESCRIPTION OF THE DRAWINGS

FIG. 7 is a graph showing a relationship between the depth from the substrate surface and the impurity concentration in a conventional MIS transistor after a doped channel layer has been formed.

DETAILED DESCRIPTION OF THE INVENTION

First Embodiment

A first embodiment of the present invention will be described with reference to the accompanying drawings.

FIGS. 1A through 1D and FIGS. 2A through 2C are cross-sectional views illustrating process steps in a method for fabricating an MIS transistor according to the first embodiment of the present invention.

Figure 1A:
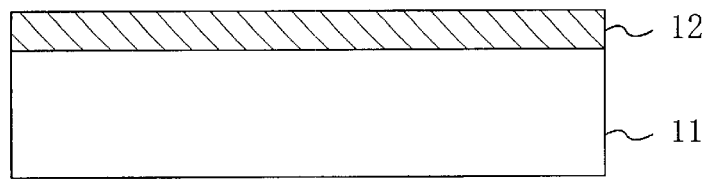
FIGS. 1A through 1D are cross-sectional views illustrating process steps in a method for fabricating an MIS transistor according to a first embodiment of the present invention.

First, as shown in FIG. 1A, a dose of about $1 \times 10^{13}/\text{cm}^2$ p-type impurity ions having a relatively large mass number, indium (In) ions for example, is implanted at an acceleration voltage of about 70 keV four times into a channel-formation region in a semiconductor substrate 11 of p-type silicon. After each implant has been carried out, the semiconductor substrate 11 is subjected to a rapid thermal annealing (RTA) process by increasing the temperature of the substrate 11 to about 850° C. through 1050° C. at a rate not less than about 100° C./sec. or preferably at a rate of about 200° C./sec., and then either maintaining the peak temperature for about 10 seconds at longest, or not maintaining the peak temperature. In this manner, the heavy-ion implantation process and the annealing process that is carried out for removing the implantation damage after each implant are repeated four times, thereby forming a p-type doped channel layer 12 as a first doped layer in an upper portion of the semiconductor substrate 11. Here, the rapid thermal annealing process in which the peak temperature is not maintained would be carried out by decreasing the annealing temperature at the point in time when the annealing temperature reaches the peak temperature.

The number of times that the heavy-ion implantation process and the subsequent annealing process are repeated does not necessarily have to be four, but an indium ion implant at an implantation dose such that the implant does not cause an amorphous layer to be formed in the channel-formation region may be repeated until the p-type doped channel layer 12 has a desired impurity concentration.

The four annealing processes performed to activate the ions in the p-type doped channel layer 12 are hereinafter referred to as first rapid thermal annealing processes.

Silicon crystal normally becomes amorphous when implanted with indium ions at a dose not less than about $5 \times 10^{13}/cm^2$. In the first embodiment, the indium ions are therefore implanted at a dose of about $1 \times 10^{13}/cm^2$ and the annealing process is carried out to remove the implantation damage after each ion implantation process has been performed. It can be thus ensured that the p-type doped channel layer 12 having a high impurity concentration is formed without causing the channel-formation region in the semiconductor substrate 11 to become amorphous.

Figure 1B:
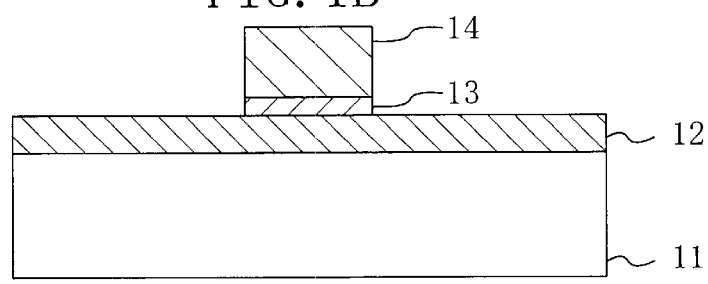

Next, as shown in FIG. 1B, a gate insulating film 13 of silicon oxide with a thickness of about 1.5 nm is formed on the semiconductor substrate 11, and a gate electrode 14 of polysilicon or poly-metal with a thickness of about 100 nm is selectively formed on the gate insulating film 13.

Figure 1C:
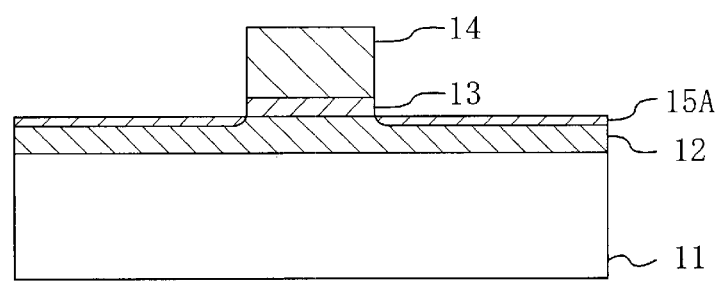

Then, as shown in FIG. 1C, with the gate electrode 14 used as a mask, a dose of about $3 \times 10^{14}/cm^2$ n-type impurity ions, ions of arsenic (As) for example, is implanted into the semiconductor substrate 11 at an acceleration voltage of 3 keV, thereby forming n-type implantation layers 15A.

Figure 1D:
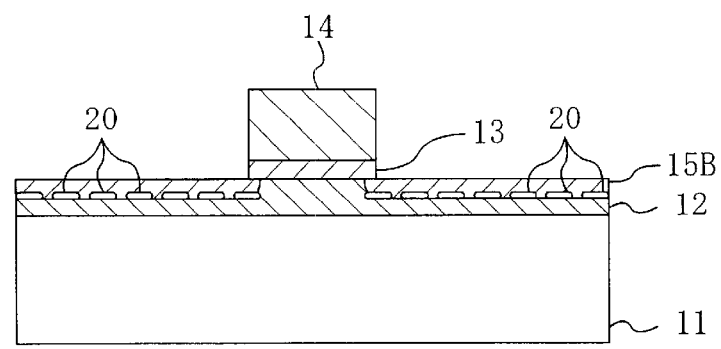

Thereafter, the semiconductor substrate 11 is subjected to a second rapid thermal annealing process by increasing the temperature of the substrate 11 to about 850° C. through 1050° C. at a rate of about 200° C./sec., and then either maintaining the peak temperature for about 10 seconds at longest, or not maintaining the peak temperature. Through the second rapid thermal annealing process, as shown in FIG. 1D, the arsenic ions contained in the n-type implantation layers 15A are diffused, whereby n-type heavily-doped extension layers 15B are formed, as second doped layers having a relatively shallow junction, in regions in the semiconductor substrate 11 laterally with respect to the gate electrode 14. The second rapid thermal annealing process also restores amorphous layers that have been formed due to the arsenic-ion implantation, to crystal layers, but causes a dislocation-loop defect layer 20 to form below an amorphous-crystal interface that has been formed during the ion implantation process. It should be understood that in the first embodiment, the n-type heavily doped extension layers 15B are formed such that their junction sites are shallower than the junction site of the p-type doped channel layer 12.

Figure 2A:
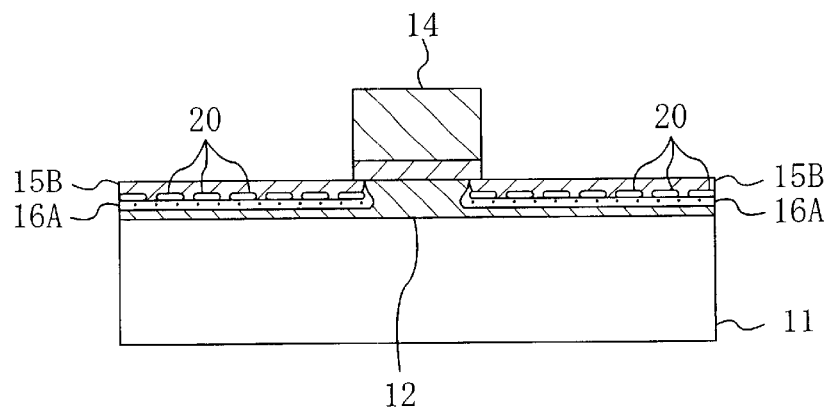
FIGS. 2A through 2C are cross-sectional views illustrating process steps in the method for fabricating an MIS transistor according to the first embodiment of the present invention.

Consequently, as shown in FIG. 2A, the indium contained in the p-type doped channel layer 12 segregates to the dislocation-loop defect layer 20 due to the second rapid thermal annealing process, such that p-type doped pocket layers 16A are formed as third doped layers under the n-type heavily-doped extension layers 15B by the interaction of the dislocation-loop defect layer 20 and the indium contained in the p-type doped channel layer 12. The p-type doped pocket layers 16A have a higher impurity concentration than the p-type doped channel layer 12.

Figure 2B:
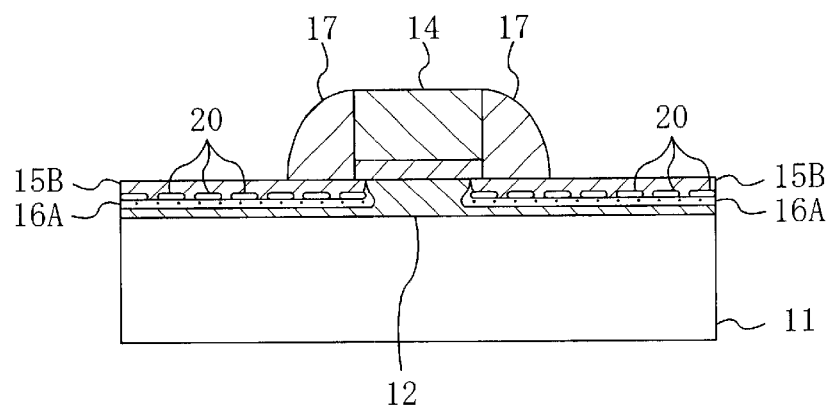

Subsequently, a silicon nitride film is deposited to a thickness of about 50 nm over the semiconductor substrate 11 and the gate electrode 14, by a CVD process, for example. The deposited silicon nitride film is then subjected to an anisotropic etching process, thereby forming sidewalls 17, as shown in FIG. 2B, out of the silicon nitride film on the lateral faces of the gate electrode 14 in the gate length direction. The sidewalls 17 may be made of silicon oxide instead of silicon nitride. Alternatively, a multilayer film composed of silicon oxide and silicon nitride may be used.

Figure 2C:
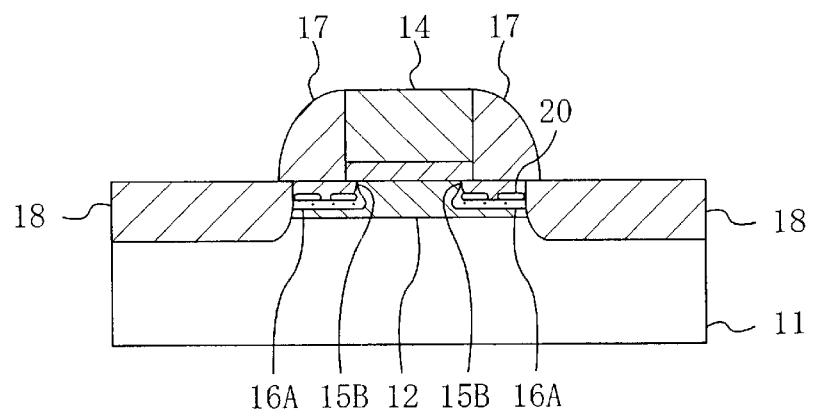

Next, with the gate electrode 14 and the sidewalls 17 used as a mask, ions of arsenic as an n-type impurity are implanted into the semiconductor substrate 11 at an acceleration voltage of 15 keV and at a dose of about $3 \times 10^{15}/cm^2$. The semiconductor substrate 11 is then subjected to a third rapid thermal annealing process by increasing the temperature of the substrate 11 to about 850° C. through 1050° C. at a rate of about 200° C./sec. through 250° C./sec., and then either maintaining the peak temperature for about 10 seconds at longest, or not maintaining the peak temperature. As shown in FIG. 2C, the arsenic ions are diffused due to the third rapid thermal annealing process, thereby forming n-type doped source/drain layers 18 as fourth doped layers in regions in the semiconductor substrate 11 laterally with respect to each sidewall 17. The n-type doped source/drain layers 18 are connected to the n-type heavily-doped extension layers 15B and have a deeper junction than the n-type heavily-doped extension layers 15B and even the p-type doped pocket layers 16A.

As described in the foregoing, in the first embodiment, indium ions, which are heavy ions having a relatively large mass number, are implanted multiple times at a dose as low as about $1 \times 10^{13}/cm^2$ in the process step for forming the p-type doped channel layer 12 shown in FIG. 1A. In addition, the annealing process is performed to remove the implantation damage in the channel-formation region after each implant, which prevents the semiconductor substrate 11 from becoming amorphous. Thus, no amorphous/crystal interface is formed in the channel-formation region by the implantation of the heavy ions performed in forming the p-type doped channel layer 12.

Accordingly, no dislocation-loop defect layer is formed in the channel-formation region in the semiconductor substrate 11 during the rapid thermal annealing process carried out after the heavy ions have been implanted. As a result, it is also possible to prevent the indium contained in the p-type doped channel layer 12 from segregating to the dislocation-loop defect layer and being deactivated during the rapid thermal annealing process.

Leakage current caused by the dislocation-loop defect layer can also be suppressed since no dislocation-loop defect layer is formed in the p-type doped channel layer 12.

In this way, it can be ensured that the p-type doped channel layer 12 having a high impurity concentration is formed by using indium ions, which are heavy ions.

In addition, since the rapid thermal annealing process is performed after every time the indium ions have been implanted, the semiconductor crystal can be restored from post-implantation damage that each ion implantation instance causes. This ensures that accumulation of post-implantation damage caused by each of the ion implantations performed at a predetermined dose, and resulting amorphization of the semiconductor substrate 11 will be prevented. As a result, since the semiconductor crystal is restored from the post-implantation damage after every time the ion implantation process has been performed, the crystal layer can also be restored from the crystal defects contained therein, which leads to a further reduction of leakage current.

The use of the indium ions, which have a relatively large mass number, in forming the p-type doped channel layer 12 also allows a so-called "retro-grade impurity profile" to be obtained. Specifically, in the p-type doped channel layer 12, the impurity concentration is low in the vicinity of the substrate surface while high in the region slightly deeper from the substrate surface. Manifestation of the short channel effect can thus be suppressed without causing any reduction in carrier mobility, which ensures the miniaturization of the transistor.

On the other hand, when the arsenic ions are implanted to form the n-type implantation layers 15A, the semiconductor substrate 11 becomes amorphous. Due to this amorphization, the dislocation-loop defect layer 20 forms below the amorphous/crystal interface thorough the second rapid thermal annealing process. As it is known that indium strongly segregates to the dislocation-loop defect layer 20, in this embodiment in which the indium ions are used as the impurity ions for forming the p-type doped channel layer 12, regions where the indium strongly segregates are formed below the dislocation-loop defect layer 20, i.e., below the junctions of the n-type heavily doped extension layers 15B. Those regions function practically as the p-type doped pocked layers 16A, which eliminates the need for furnishing the process step for forming the p-type doped pocked layers 16A.

In the first embodiment, indium ions are used as the impurity ions for forming the p-type doped channel layer 12. Instead of the indium ions, however, ions of an element that act as p-type impurity ions and are heavier than boron ions may be used. Alternatively, both boron ions and ions of an element that act as p-type impurity ions and are heavier than the boron ions may be used. Alternatively, a Group IIIB element having a mass number larger than that of indium may be used.

Note that the second rapid thermal annealing process performed in the process step shown in FIG. 1D may be omitted. In that case, the n-type heavily doped extension layers 15B, the p-type doped pocked layers 16A and the n-type doped source/drain layers 18 are formed at the same time through the third rapid thermal annealing process performed in the process step shown in FIG. 2C.

Although the semiconductor device of the first embodiment is an n-channel MIS transistor, it may be a p-channel MIS transistor instead. In the case of a p-channel MIS transistor, ions of a Group VB element that are heavier than arsenic ions, such as antimony (Sb) ions or bismuth (Bi) ions, may be used as n-type impurity ions for forming a doped channel layer.

Second Embodiment

A second embodiment of the present invention will be described with reference to the accompanying drawings.

FIGS. 3A through 3C and FIGS. 4A through 4C are cross-sectional views illustrating process steps in a method for fabricating an MIS transistor according to the second embodiment of the present invention. In the second embodiment, p-type doped pocket layers are positively formed under n-type heavily-doped extension layers.

Figure 3A:
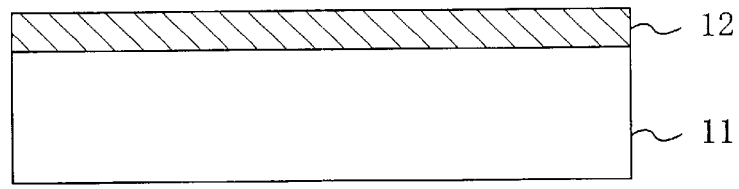
FIGS. 3A through 3C are cross-sectional views illustrating process steps in a method for fabricating an MIS transistor according to a second embodiment of the present invention.

First, as shown in FIG. 3A, a dose of about $1 \times 10^{13}/cm^2$ p-type impurity ions having a relatively large mass number, indium (In) ions for example, is implanted at an acceleration voltage of about 70 keV four times into a channel-formation region in a semiconductor substrate 11 of p-type silicon. After each implant has been carried out, the semiconductor substrate 11 is subjected to a rapid thermal annealing (RTA) process by increasing the temperature of the substrate 11 to about 850° C. through 1050° C. at a rate not less than about 100° C./sec. or preferably at a rate of about 200° C./sec., and then either maintaining the peak temperature for about 10 seconds at longest, or not maintaining the peak temperature. In this manner, the heavy-ion implantation process and the annealing process that is carried out for removing the implant damage after each implant are repeated four times, thereby forming a p-type doped channel layer 12 as a first doped layer in an upper portion of the semiconductor substrate 11.

The number of times that the heavy-ion implantation process and the subsequent annealing process are repeated does not necessarily have to be four, but an indium ion implant at an implantation dose such that the implant does not cause an amorphous layer to be formed in the channel-formation region may be repeated until the p-type doped channel layer 12 has a desired impurity concentration.

The four annealing processes performed to activate the ions in the p-type doped channel layer 12 are hereinafter referred to as first rapid thermal annealing processes.

Figure 3B:
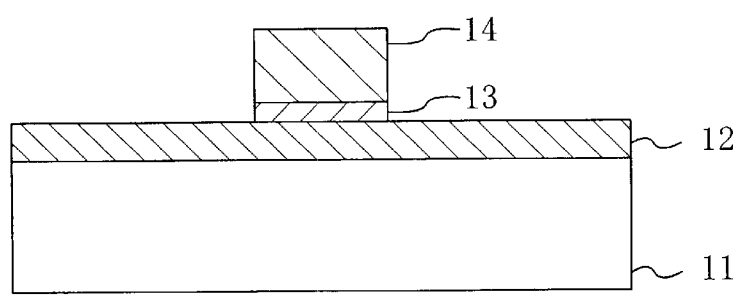

Next, as shown in FIG. 3B, a gate insulating film 13 of silicon oxide with a thickness of about 1.5 nm is formed on the semiconductor substrate 11, and a gate electrode 14 of polysilicon or poly-metal with a thickness of about 100 nm is selectively formed on the gate insulating film 13.

Figure 3C:
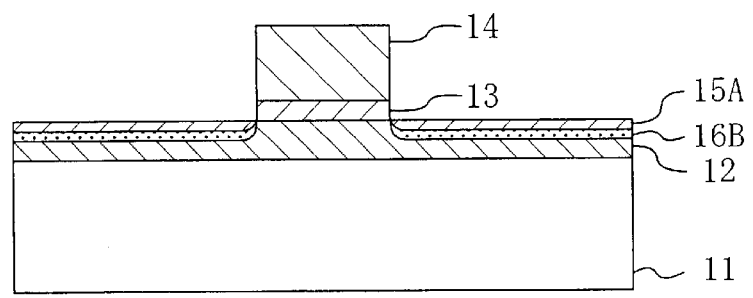

Next, as shown in FIG. 3C, with the gate electrode 14 used as a mask, a dose of about $3 \times 10^{14}/cm^2$ n-type impurity ions, ions of arsenic (As) for example, is implanted into the semiconductor substrate 11 at an acceleration voltage of 3 keV, thereby forming n-type implantation layers 15A. Then, with the gate electrode 14 used as a mask, a dose of approximately $1 \times 10^{13}/cm^2$ p-type impurity ions, ions of boron (B), for example, is implanted into the semiconductor substrate 11 at an acceleration voltage of 15 keV, thereby forming p-type implantation layers 16B under the n-type implantation layers 15A. Note that either the arsenic ion implantation process or the boron ion implantation process may be performed first.

Figure 4A:
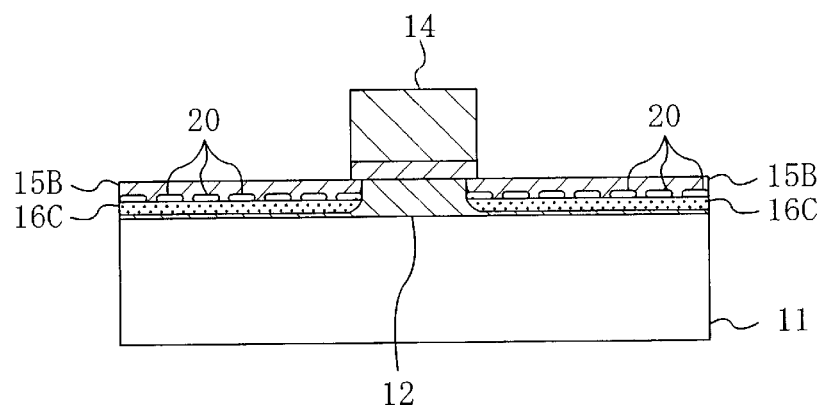
FIGS. 4A through 4C are cross-sectional views illustrating process steps in the method for fabricating an MIS transistor according to the second embodiment of the present invention.

Thereafter, the semiconductor substrate 11 is subjected to a second rapid thermal annealing process by increasing the temperature of the substrate 11 to about 850° C. through 1050° C. at a rate of about 200° C./sec., and then either maintaining the peak temperature for about 10 seconds at longest, or not maintaining the peak temperature. Through the second rapid thermal annealing process, as shown in FIG. 4A, the arsenic ions contained in the n-type implantation layers 15A are diffused, whereby n-type heavily-doped extension layers 15B are formed, as second doped layers having a relatively shallow junction, in regions in the semiconductor substrate 11 laterally with respect to the gate electrode 14, and the boron ions contained in the p-type implantation layers 16B are diffused, whereby p-type doped pocket layers 16C are formed in regions in the semiconductor substrate 11 under the n-type heavily-doped extension layers 15B. The second rapid thermal annealing process also restores amorphous layers that have been formed by the arsenic-ion implantation, to crystal layers, but causes a dislocation-loop defect layer 20 to form below an amorphous-crystal interface that has been formed during the ion implantation process. It should be understood that in the second embodiment, the n-type heavily doped extension layers 15B are also formed such that their junction sites are shallower than the junction site of the p-type doped channel layer 12.

Figure 4B:
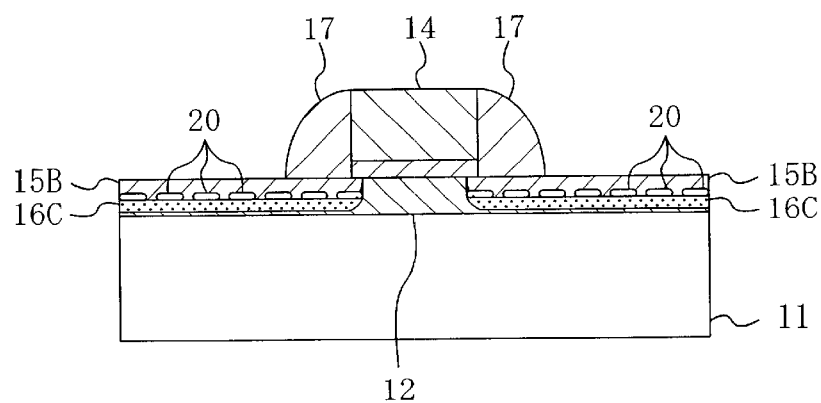

Subsequently, a silicon nitride film is deposited to a thickness of about 50 nm over the semiconductor substrate 11 and the gate electrode 14, by a CVD process, for example. The deposited silicon nitride film is then subjected to an anisotropic etching process, thereby forming sidewalls 17 as shown in FIG. 4B out of the silicon nitride film on the lateral faces of the gate electrode 14 in the gate length direction. The sidewalls 17 may be made of silicon oxide instead of silicon nitride. Alternatively, a multilayer film composed of silicon oxide and silicon nitride may be used.

Figure 4C:
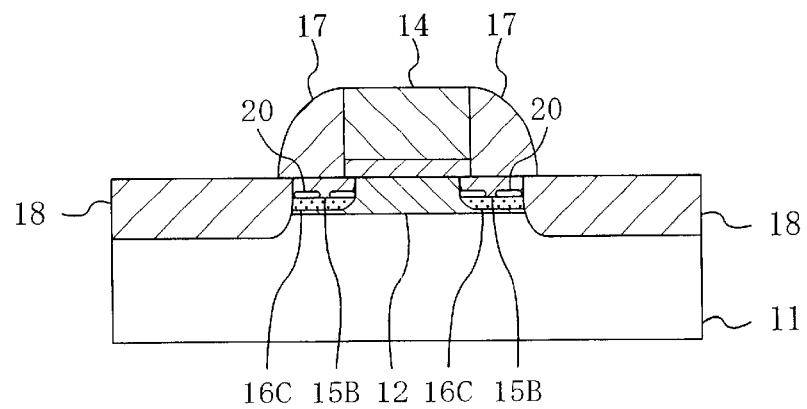
Figure 5A:
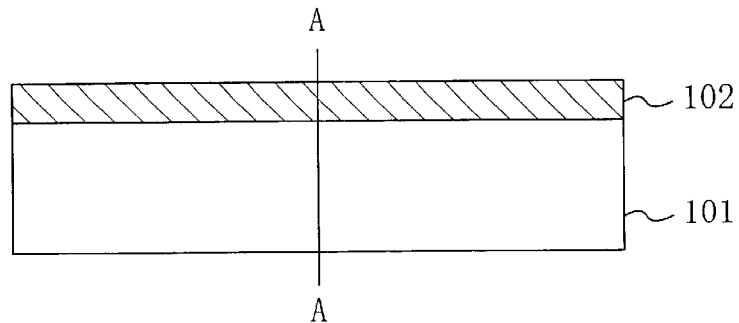
FIGS. 5A through 5C are cross-sectional views illustrating process steps in a conventional method for fabricating an MIS transistor.
Figure 5B:
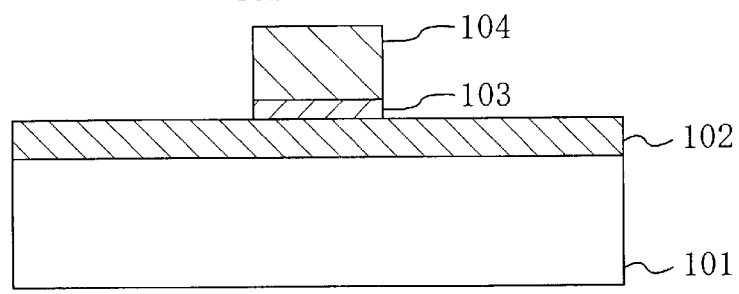
Figure 5C:
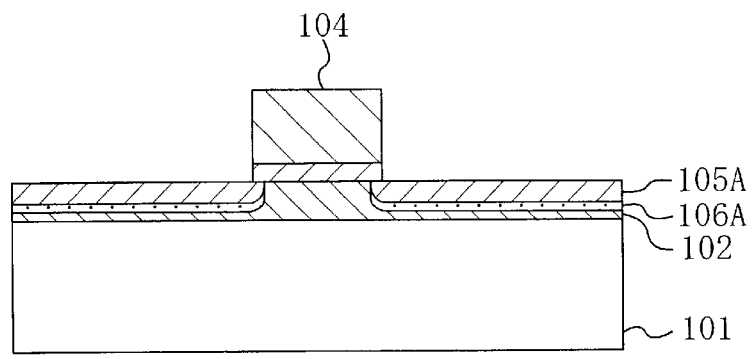
Figure 6A:
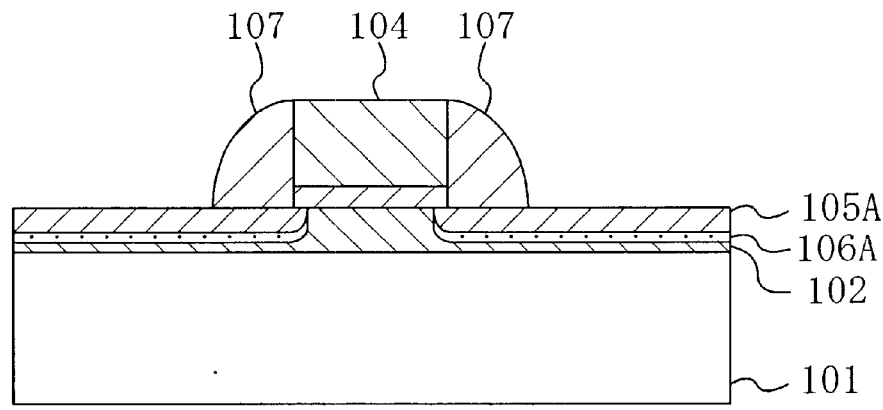
FIGS. 6A and 6B are cross-sectional views illustrating process steps in the conventional method for fabricating an MIS transistor.
Figure 6B:
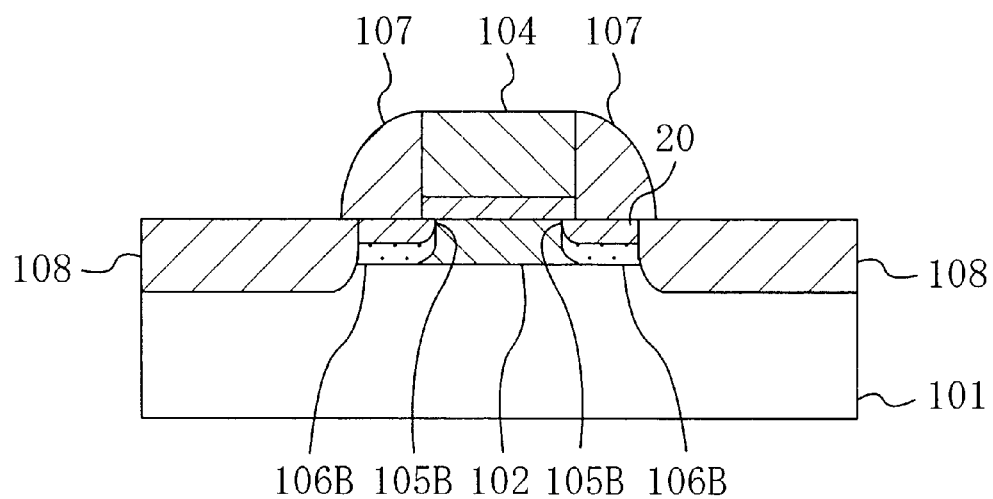

Next, with the gate electrode 14 and the sidewalls 17 used as a mask, ions of arsenic as an n-type impurity are implanted into the semiconductor substrate 11 at an acceleration voltage of 15 keV and at a dose of about $3 \times 10^{15}/cm^2$. The semiconductor substrate 11 is then subjected to a third rapid thermal annealing process by increasing the temperature of the substrate 11 to about 850° C. through 1050° C. at a rate of about 200° C./sec. through 250° C./sec., and then either maintaining the peak temperature for about 10 seconds at longest, or not maintaining the peak temperature. As shown in FIG. 4C, the arsenic ions are diffused due to the third rapid thermal annealing process, thereby forming n-type doped source/drain layers 18 as fourth doped layers in regions in the semiconductor substrate 11 laterally with respect to each sidewall 17. The n-type doped source/drain layers 18 are connected to the n-type heavily-doped extension layers 15B and have a deeper junction than the n-type heavily-doped extension layers 15B and even the p-type doped pocket layers 16C.

According to the second embodiment, as described in the foregoing and as in the first embodiment, indium ions, which are heavy ions, are implanted multiple times at a dose as low as about $1 \times 10^{13}/cm^2$ in the process step for forming the p-type doped channel layer 12 shown in FIG. 3A. In addition, the annealing process is performed to remove the implantation damage in the channel-formation region after each implant, which prevents the semiconductor substrate 11 from becoming amorphous. Thus, no amorphous/crystal interface is formed in the channel-formation region by the implantation of the heavy ions performed in forming the p-type doped channel layer 12. Accordingly, no dislocation-loop defect layer is formed in the channel-formation region in the semiconductor substrate 11 through the rapid thermal annealing process carried out after the heavy ions have been implanted. As a result, it is also possible to prevent the indium contained in the p-type doped channel layer 12 from segregating to the dislocation-loop defect layer and being deactivated during the rapid thermal annealing process.

Leakage current caused by the dislocation-loop defect layer can also be suppressed since no dislocation-loop defect layer is formed in the p-type doped channel layer 12.

In this way, it can be ensured that the p-type doped channel layer 12 having a high impurity concentration is formed by using indium ions, which are heavy ions.

In addition, the use of the indium ions, which have a relatively large mass number, in forming the p-type doped channel layer 12 allows a retro-grade impurity profile to be obtained for the p-type doped channel layer 12. Manifestation of the short channel effect can be therefore suppressed without causing any reduction in carrier mobility, which ensures the miniaturization of the transistor.

In the second embodiment, the implantation of the arsenic ions performed to form the n-type implantation layers 15A and the subsequent second rapid thermal annealing process also cause the dislocation-loop defect layer 20 to form below the amorphous/crystal interface. As set forth by this embodiment, since the indium ions are used as the impurity ions for forming the p-type doped channel layer 12, regions where the indium strongly segregates are formed below the dislocation-loop defect layer 20, i.e., below the junctions of the n-type heavily doped extension layers 15B, such that the p-type doped pocked layers are practically formed. In addition, in the second embodiment, the p-type implantation layers 16B are formed by implanting boron ions into the regions under the n-type implantation layers 15A in the process step shown in FIG. 3C. This makes up for impurity concentration deficiency in the p-type doped pocket layers 16C.

Furthermore, the dose of the boron ions implanted for forming the p-type implantation layers 16B are set to such a value as not to cause the semiconductor substrate 11 to become amorphous. No amorphous/crystal interface is thus formed due to the boron ion implantation.

In the second embodiment, indium ions are also used as the impurity ions for forming the p-type doped channel layer 12. Instead of the indium ions, however, ions of an element that act as p-type impurity ions and are heavier than boron ions may be used. Alternatively, both boron ions and ions of an element that act as p-type impurity ions and are heavier than the boron ions may be used. Alternatively, a Group IIIB element having a mass number larger than that of indium may be used.

Note that the second rapid thermal annealing process performed in the process step shown in FIG. 4A may be omitted. In that case, the n-type heavily doped extension layers 15B, the p-type doped pocked layers 16C and the n-type doped source/drain layers 18 are formed at the same time through the third rapid thermal annealing process performed in the process step shown in FIG. 4C.

Although the foregoing description is made for the case of an n-channel MIS transistor as the semiconductor device of this embodiment, the present invention is also applicable to a p-channel MIS transistor. In the case of a p-channel MIS transistor, ions of a Group VB element that are heavier than arsenic ions, such as antimony ions or bismuth ions, may be used as n-type impurity ions for forming a doped channel layer.

What is claimed is:

1. A method for fabricating a semiconductor device, comprising the steps of:
   (a) implanting ions of a first impurity of a first conductivity type, which are heavy ions having a relatively large mass number, multiple times into a channel-formation region in a semiconductor substrate at a dose such that the channel-formation region is not caused to become amorphous, and carrying out a first annealing process after each of the ion implantations has been performed, thereby removing the implantation damage in the channel-formation region and at the same time forming a first doped layer of the first conductivity type in the channel-formation region;
   (b) forming a gate insulating film on the semiconductor substrate, and selectively forming a gate electrode on the gate insulating film;
   (c) implanting ions of a second impurity of a second conductivity type into the semiconductor substrate with the gate electrode used as a mask; and
   (d) subjecting the semiconductor substrate to a second annealing process to diffuse the ions of the second impurity, thereby forming a second doped layer of the second conductivity type having a relatively shallow junction site.

2. The method of claim 1, wherein in said step (d), a dislocation-loop defect layer is formed in the second doped layer in the semiconductor substrate, and by segregation of the ions of the first impurity to the dislocation-loop defect layer, a third doped layer of the first conductivity type is formed in a region under the second doped layer.

3. The method of claim 1, further comprising, between said steps (b) and (d), the steps of:

implanting ions of a third impurity of the first conductivity type into the semiconductor substrate with the gate electrode used as a mask; and through the second annealing process, diffusing the ions of the third impurity to form a third doped layer of the first conductivity type under the second doped layer.

4. The method of claim 1, further comprising the steps of, after said step (d) has been performed:

forming a sidewall out of an insulating film on a lateral face of the gate electrode; and implanting ions of a fourth impurity of the second conductivity type into the semiconductor substrate with the gate electrode and the sidewall used as a mask, and then performing a third annealing process to diffuse the ions of the fourth impurity, thereby forming, outside the second doped layer, a fourth doped layer of the second conductivity type, the fourth doped layer having a deeper junction than the second doped layer.

5. The method of claim 1, wherein the heavy ions are implanted at a dose not more than approximately $5 \times 10^{13}/cm^2$.

6. The method of claim 1, wherein the first annealing process is a rapid thermal annealing process in which the annealing temperature is increased to a peak temperature of about 850° C. through 1050° C. at a rate not less than about 100° C./sec. and then the peak temperature is either maintained for about ten seconds at longest, or not maintained.

7. The method of claim 1, wherein the heavy ions are indium ions.

* * * * *